(12) United States Patent
Kim et al.

(10) Patent No.: US 9,324,886 B2
(45) Date of Patent: Apr. 26, 2016

(54) SOLAR CELL AND METHOD OF MANUFACTURING THE SAME

(75) Inventors: Sunho Kim, Seoul (KR); Heonmin Lee, Seoul (KR); Kwangsun Ji, Seoul (KR); Youngjoo Eo, Seoul (KR); Junghoon Choi, Seoul (KR); Sehwon Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 33 days.

(21) Appl. No.: 12/622,185

(22) Filed: Nov. 19, 2009

(65) Prior Publication Data

US 2010/0132792 A1    Jun. 3, 2010

(30) Foreign Application Priority Data

Nov. 19, 2008    (KR) .................. 10-2008-0115121

(51) Int. Cl.
| | |
|---|---|
| H01L 31/00 | (2006.01) |
| H01L 31/0224 | (2006.01) |
| H05K 3/18 | (2006.01) |
| C25D 7/12 | (2006.01) |
| H01L 31/20 | (2006.01) |
| H05K 3/24 | (2006.01) |

(52) U.S. Cl.
CPC ........ *H01L 31/022425* (2013.01); *C25D 7/126* (2013.01); *H05K 3/188* (2013.01); *H01L 31/20* (2013.01); *H01L 31/202* (2013.01); *H05K 3/246* (2013.01); *H05K 2201/0108* (2013.01); *H05K 2201/0326* (2013.01); *Y02E 10/50* (2013.01)

(58) Field of Classification Search
CPC .............. H01L 31/022425; H01L 31/068; H01L 31/0682; H01L 31/0747; H01L 31/18; H01L 31/1804; H01L 31/20; H01L 31/202; Y02E 10/50

USPC ......................................................... 136/258
See application file for complete search history.

(56) References Cited

U.S. PATENT DOCUMENTS

| | | | |
|---|---|---|---|
| 4,586,988 A | 5/1986 | Nath et al. | |
| 6,441,297 B1 * | 8/2002 | Keller et al. | .................. 136/249 |
| 6,815,246 B2 | 11/2004 | Gonsiorawski et al. | |
| 2002/0084503 A1 | 7/2002 | Lee et al. | |
| 2006/0130891 A1 * | 6/2006 | Carlson | .................... 136/256 |
| 2007/0169806 A1 | 7/2007 | Fork et al. | |

(Continued)

FOREIGN PATENT DOCUMENTS

| | | |
|---|---|---|
| EP | 0 531 827 A1 | 3/1993 |
| EP | 1 865 563 A2 | 12/2007 |

(Continued)

OTHER PUBLICATIONS

Neuhaus et al., "Industrial Silicon Wafer Solar Cells", Advances in Optoelectronics, 2007.*
Alemán et al., "Industrially Feasible Front-Side Metallization Based on Ink-Jet Masking and Nickel Plating" Presented at the 23rd European Photovoltaic Solar Energy Conference, Sep. 1-5, 2008, Valencia Spain.

*Primary Examiner* — Matthew Martin
(74) *Attorney, Agent, or Firm* — Birch, Stewart, Kolasch & Birch, LLP

(57) ABSTRACT

A solar cell and a method of manufacturing the same are disclosed. The solar cell includes a substrate, at least one emitter layer on the substrate, at least one first electrode electrically connected to the at least one emitter layer, and at least one second electrode electrically connected to the substrate. At least one of the first electrode and the second electrode is formed using a plating method.

20 Claims, 13 Drawing Sheets

(56) References Cited

U.S. PATENT DOCUMENTS

| | | | |
|---|---|---|---|
| 2008/0000521 A1* | 1/2008 | Sivoththaman et al. | 136/254 |
| 2008/0000522 A1 | 1/2008 | Johnson et al. | |
| 2008/0011350 A1 | 1/2008 | Luch | |
| 2008/0023068 A1* | 1/2008 | Nakashima et al. | 136/256 |
| 2008/0053519 A1* | 3/2008 | Pearce et al. | 136/252 |
| 2008/0121279 A1* | 5/2008 | Swanson | 136/258 |
| 2008/0128019 A1* | 6/2008 | Lopatin et al. | 136/252 |
| 2009/0120494 A1* | 5/2009 | Moon et al. | 136/256 |
| 2009/0238994 A1 | 9/2009 | Mette et al. | |

FOREIGN PATENT DOCUMENTS

| | | |
|---|---|---|
| JP | 5-63218 A | 3/1993 |
| JP | 2000-223443 A | 8/2000 |
| KR | 1020020059186 A | 7/2002 |
| KR | 1020030088665 A | 11/2003 |
| WO | WO 2007/085448 A1 | 8/2007 |

* cited by examiner

US 9,324,886 B2

SOLAR CELL AND METHOD OF MANUFACTURING THE SAME

This application claims priority to and the benefit of Korean Patent Application No. 10-2008-00115121 filed in the Korean Intellectual Property Office on Nov. 19, 2008, the entire contents of which are incorporated herein by reference.

BACKGROUND OF THE INVENTION

1. Field of the Invention

Embodiments of the invention relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

Because the electrodes respectively connected to the substrate and the emitter layer are respectively positioned on the substrate and the emitter layer, the electrodes collect the holes and the electrons respectively moving to the substrate and the emitter layer and allow the holes and the electrons to move to a load connected to the outside.

However, in this case, because the electrodes are formed on the emitter layer on an incident surface of the substrate, on which light is incident, as well as a non-incident surface of the substrate, on which light is not incident, an incident area of light decreases. Hence, efficiency of the solar cell is reduced.

Accordingly, a back contact solar cell was developed so as to increase the incident area of light. In the back contact solar cell, all of electrodes collecting electrons and holes are formed on a rear surface of a substrate.

SUMMARY OF THE INVENTION

In one aspect, there is a solar cell including a substrate, at least one emitter layer on the substrate, at least one first electrode electrically connected to the at least one emitter layer, and at least one second electrode electrically connected to the substrate, wherein at least one of the first electrode and the second electrode is formed using a plating method.

At least one of the first electrode and the second electrode may include a first conductive layer and a second conductive layer on the first conductive layer.

A density of the first conductive layer may be different from a density of the second conductive layer. The density of the second conductive layer may be greater than the density of the first conductive layer.

The first conductive layer may be formed of a conductive metal material or a transparent conductive material. The second conductive layer may be formed of a conductive metal material.

At least one of the first electrode and the second electrode may have specific resistance of about $3.3 \times 10^{-6}$ $\Omega$cm. At least one of the first electrode and the second electrode may have a width of about 10 μm to 100 μm. At least one of the first electrode and the second electrode may have a height of about 10 μm to 20 μm.

The substrate and the at least one emitter layer may be formed of different forms of silicon.

The substrate may be formed of crystalline silicon, and the at least one emitter layer may be formed of amorphous silicon.

The solar cell may further include a transparent conductive oxide layer on the at least one emitter layer. The at least one first electrode may be electrically connected to the at least one emitter layer through the transparent conductive oxide layer.

The at least one first electrode and the at least one second electrode may be positioned on opposite surfaces of the substrate.

The solar cell may further include a first transparent conductive oxide layer on the at least one emitter layer and a second transparent conductive oxide layer on the substrate. The at least one first electrode may be electrically connected to the at least one emitter layer through the first transparent conductive oxide layer, and the at least one second electrode may be electrically connected to the substrate through the second transparent conductive oxide layer.

The at least one first electrode and the at least one second electrode may be positioned on opposite surfaces of the substrate.

The solar cell may further include at least one back surface field layer on the substrate. The at least one second electrode may be electrically connected to the substrate through the at least one back surface field layer.

The at least one emitter layer and the at least one back surface field layer may be positioned on the same surface of the substrate.

In another aspect, there is a solar cell including a substrate formed of a first semiconductor, a plurality of emitter layers on the substrate, the plurality of emitter layers being formed of a second semiconductor different from the first semiconductor, a plurality of first electrodes electrically connected to the plurality of emitter layers, and a plurality of second electrodes electrically connected to the substrate, wherein at least one of the first electrode and the second electrode is formed using a plating method.

At least one of the first electrode and the second electrode may include a first conductive layer, and a second conductive layer on the first conductive layer.

A density of the second conductive layer may be greater than a density of the first conductive layer.

The plurality of emitter layers and the plurality of first electrodes may be positioned on the same surface of the substrate as the plurality of second electrodes.

In another aspect, there is a method of manufacturing a solar cell including forming an emitter layer of a second conductive type opposite a first conductive type on a substrate of the first conductive type, and forming a first electrode electrically connected to the emitter layer and a second electrode electrically connected to the substrate, wherein the forming of the first and second electrodes includes plating a conductive material to form at least one of the first and second electrodes, and the substrate and the emitter layer are formed of different semiconductors.

The forming of the first and second electrodes may include forming a transparent conductive oxide layer on at least one of the substrate and the emitter layer, forming a first conductive layer on a portion of the transparent conductive oxide layer using a direct printing method, and plating the conductive material on the first conductive layer using the first conductive layer as a seed layer to form a second conductive layer on the first conductive layer and thereby forming at least one of the first and second electrodes.

The forming of the first and second electrodes may include forming a transparent conductive oxide layer on at least one of the substrate and the emitter layer, forming a plating resist layer on a portion of the transparent conductive oxide layer to expose another portion of the transparent conductive oxide layer, plating the conductive material on the exposed portion of the transparent conductive oxide layer using the exposed portion of the transparent conductive oxide layer as a seed layer to form at least one of the first and second electrodes, and removing the plating resist layer.

The forming of the first and second electrodes may include forming a first conductive layer on a portion of at least one of the substrate and the emitter layer using a direct printing method, and plating the conductive material on the first conductive layer using the first conductive layer as a seed layer to form a second conductive layer on the first conductive layer and thereby forming at least one of the first and second electrodes.

The first electrode and the second electrode may be positioned on the same surface of the substrate.

The forming of the first and second electrodes may include forming a conductive layer on at least one of the substrate and the emitter layer, forming a plating resist layer on a portion of the conductive layer to expose a portion of the conductive layer, plating the conductive material on the exposed portion of the conductive layer using the exposed portion of the conductive layer as a seed layer to form at least one of the first and second electrodes, forming an etch stop layer on at least one of the first and second electrodes to expose the plating resist layer, and removing the exposed plating resist layer and the conductive layer underlying the exposed plating resist layer and removing the etch stop layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
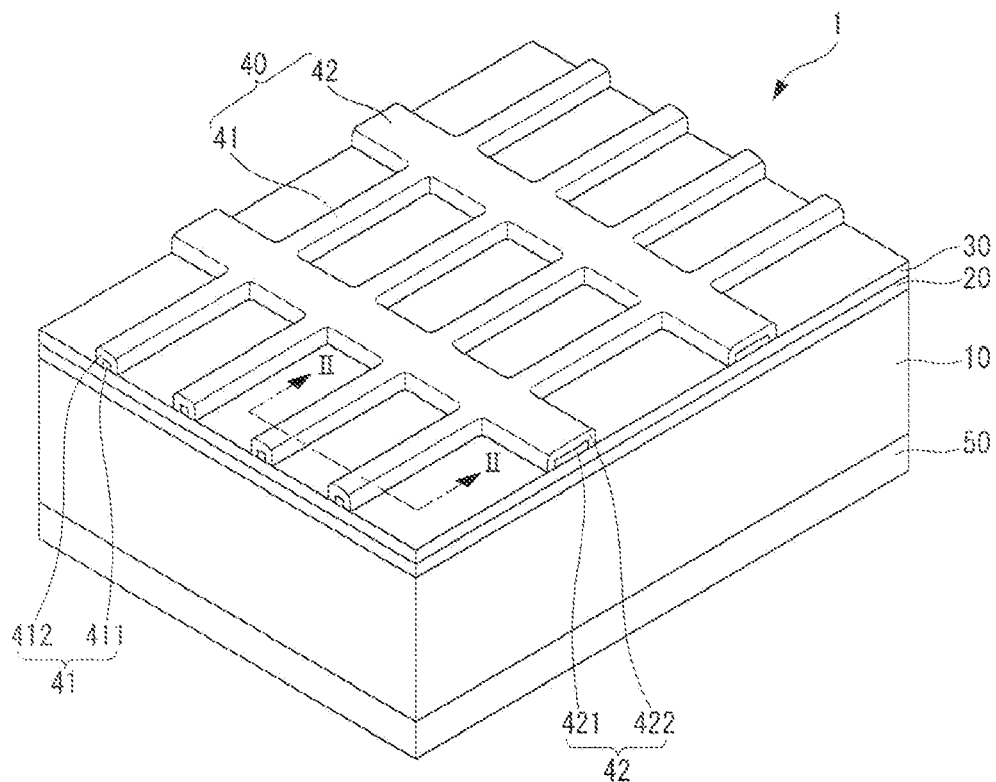
FIG. 1 is a partial perspective view of a solar cell according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A solar cell according to an embodiment of the invention is described below in detail with reference to FIGS. 1 to 3.

FIG. 1 is a partial perspective view of a solar cell according to an embodiment of the invention. FIG. 2 is a cross-sectional view taken along the line II-II of FIG. 1. FIG. 3 illustrates an example of a width and a thickness of a front electrode.

As shown in FIG. 1, a solar cell 1 according to an embodiment of the invention includes a substrate 10, an emitter layer 20 on a surface (hereinafter, referred to as "a front surface") of the substrate 10 on which light is incident, a transparent conductive oxide layer 30 on the emitter layer 20, a first electrode part 40 (hereinafter, referred to as "a front electrode part") that is formed on the transparent conductive oxide layer 30 and electrically connected to the transparent conductive oxide layer 30, and a second electrode 50 (hereinafter, referred to as "a rear electrode") that is formed on a surface (hereinafter, referred to as "a rear surface") of the substrate 10, on which the light is not incident, opposite the front surface of the substrate 10 and is electrically connected to the substrate 10.

The substrate 10 is formed of a first conductive type silicon, for example, p-type silicon, though not required. Silicon used in the substrate 10 is crystalline silicon, such as single crystal silicon and/or polycrystalline silicon. If the substrate 10 is of a p-type, the substrate 10 may contain impurities of a group III element such as boron (B), gallium (Ga), and indium (In). Alternatively, the substrate 10 may be of an n-type, and/or be formed of other materials than silicon. If the substrate 10 is of an n-type, the substrate 10 may contain impurities of a group V element such as phosphor (P), arsenic (As), and antimony (Sb).

The emitter layer 20 is formed substantially entirely on the front surface of the substrate 10. The emitter layer 20 is formed of a material of a second conductive type (for example, an n-type) opposite the first conductive type of the substrate 10, and the semiconductor material (or a material characteristic) of the emitter layer 20 may be one (e.g., amorphous silicon) that is different from the semiconductor material (or a material characteristic) of the substrate 10 (e.g., non-amorphous silicon). Thus, the emitter layer 20 and the substrate 10 form a hetero junction as well as a p-n junction. The n-type emitter layer 20 contains impurities of a group V element such as P, As, and Sb. Reference to different semiconductor material may also refer to different forms of a semiconductor material.

A plurality of electron-hole pairs produced by light incident on the substrate 10 is separated into electrons and holes by a built-in potential difference resulting from the p-n junction. Then, the separated electrons move to an n-type semiconductor, and the separated holes move to a p-type semiconductor. Thus, if the substrate 10 is of the p-type and the emitter layer 20 is of the n-type, the separated holes and the separated electrons may move to the substrate 10 and the emitter layer 20, respectively.

Because the substrate 10 and the emitter layer 20 form the p-n junction as described above, the emitter layer 20 may be of the p-type if the substrate 10 is of the n-type, unlike the embodiment described above. In this case, the p-type emitter layer 20 may contain impurities of a group III element such as B, Ga, and In, and the separated electrons and the separated holes may move to the substrate 10 and the emitter layer 20, respectively.

The transparent conductive oxide layer 30 is a conductive layer based on an oxide layer and transfers carriers (e.g., electrons) moving to the emitter layer 20 to the front electrode part 40. In addition, the transparent conductive oxide layer 30 may serve as an anti-reflection layer. The transparent conductive oxide layer 30 is formed of a material having specific resistance ($\rho$) lower than the emitter layer 20 and having good conductivity and transmittance. For example, the transparent conductive oxide layer 30 may be formed of material selected from the group consisting of indium tin oxide (ITO), tin-based oxide (e.g., $SnO_2$), AgO, $ZnO$—$Ga_2O_3$ (or $Al_2O_3$), fluorine tin oxide (FTO), and/or a combination thereof. Other materials may be used.

The front electrode part 40, as shown in FIG. 1, includes a plurality of first electrodes (hereinafter, referred to as "a plurality of front electrodes") 41 and a plurality of current collectors 42.

The plurality of front electrodes 41 are positioned on the transparent conductive oxide layer 30 to be spaced apart from one another at a uniform distance, thought not required. Further, the front electrodes 41 extend substantially parallel to one another in a fixed direction. Each of the front electrodes 41 collects carriers (e.g., electrons) moving to the emitter layer 20 through the transparent conductive oxide layer 30.

The plurality of current collectors 42 are positioned at the same level (or surface) as the front electrodes 41 and are electrically connected to the front electrodes 41. The current collectors 42 extend substantially parallel to one another in a direction crossing the front electrodes 41. The current collectors 42 collect carriers received from the front electrodes 41 to output the carriers to an external device.

Each of the front electrodes 41 includes first and second conductive layers 411 and 412, and each of the current collectors 42 includes first and second conductive layers 421 and 422.

Each of the first conductive layers 411 and 421 is formed using a direct printing method. In a screen printing method, a pattern is formed using auxiliary means, such as a pattern mask. On the other hand, in the direct printing method, such a pattern formed in the screen printing method is not formed, and the first conductive layers 411 and 421 are formed by directly coating a desired front electrode pattern and a desired current collector pattern on the transparent conductive oxide layer 30. Examples of the direct printing method include an inkjet printing method, an electro hydrodynamic (EHD) jet printing method, an offset printing method, a gravure printing method, a flexo printing method, and an aerosol jet printing method.

The first conductive layers 411 and 421 are formed of a conductive metal material. Examples of the conductive metal material include at least one selected from the group consisting of nickel (Ni), copper (Cu), silver (Ag), aluminum (Al), tin (Sn), zinc (Zn), indium (In), titanium (Ti), gold (Au), and a combination thereof.

A width of each of the first conductive layers 411 and 421 varies depending on a material used, and also may vary depending on a pattern, a shape, a size, etc., of each of the front electrode 41 and the current collector 42. The width and a height of each of the first conductive layers 411 and 421 may be approximately several μm to several nm.

The second conductive layers 412 and 422 are respectively positioned on the first conductive layers 411 and 421, and are formed using a plating method. The second conductive layers 412 and 422 may be formed of at least one selected from the group consisting of Ni, Cu, Ag, Al, Sn, Zn, In, Ti, Au, and a combination thereof. Other conductive metal materials may be used. In the embodiment, the second conductive layers 412 and 422 are formed using an electroplating method. However, other plating methods, such as an electroless plating method, may be used.

A plating condition for forming the second conductive layers 412 and 422 is that plating is performed only on the first conductive layers 411 and 421 in consideration of a conductivity difference between the transparent conductive oxide layer 30 and the first conductive layers 411 and 421. More specifically, plating may be performed on a desired portion, i.e., only on the first conductive layers 411 and 421 by adjusting time required in the plating or a current amount depending on the conductivity difference between the transparent conductive oxide layer 30 and the first conductive layers 411 and 421 to form the second conductive layers 412 and 422.

A thickness of each of the second conductive layers 412 and 422 thus formed varies depending on the material used, time required in the plating, the current amount, etc., and also may vary depending on a shape of the first conductive layers 411 and 421.

A width and a height of each of the second conductive layers 412 and 422 may be approximately several μm to several tens of μm.

The first conductive layers 411 and 421 and the second conductive layers 412 and 422 formed using different methods, i.e., respectively using the direct printing method and the plating method have different densities. A density of the second conductive layers 412 and 422 formed using the plating method may be greater than a density of the first conductive layers 411 and 421 formed using the direct printing method.

Each of the front electrode 41 and the current collector 42 thus formed may have a width of about 10 μm to 100 μm and a height of about 10 μm to 20 μm depending on a material used.

The rear electrode 50 is formed substantially entirely on the rear surface of the substrate 10. The rear electrode 50 collects carriers (e.g., holes) moving to the substrate 10. The rear electrode 50 is formed of a conductive metal material and may be formed of various materials depending on a formation method. For example, if the rear electrode 50 is formed using a screen printing method, the rear electrode 50 may be formed of material selected from the group consisting of Ag, Al, and a combination thereof, or a conductive high polymer mixture. If the rear electrode 50 is formed using an inkjet method or a dispensing method, the rear electrode 50 may be formed of material selected from the group consisting of Ni, Ag, and a combination thereof. If the rear electrode 50 is formed using a plating method, the rear electrode 50 may be formed of material selected from the group consisting of Ni, Cu, Ag, and a combination thereof. If the rear electrode 50 is formed using a deposition method, the rear electrode 50 may be formed of material selected from the group consisting of Al, Ni, Cu, Ag, Ti, palladium (Pd), chromium (Cr), tungsten (W), and a combination thereof.

Figure 3:
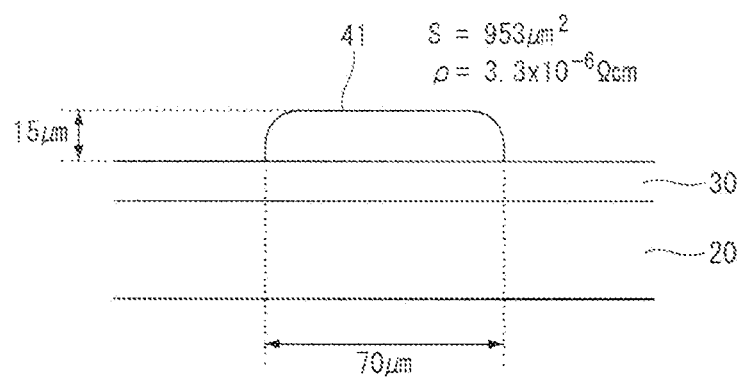
FIG. 3 illustrates an example of a width and a thickness of a front electrode.

FIG. 3 illustrates changes in characteristics of the front electrodes 41 when the front electrodes 41 are formed using the plating method as described above.

The front electrode 41 shown in FIG. 3 was completed by forming the first conductive layer 421 in a desired portion using, for example, Ag through the direct printing method and then forming the second conductive layer 422 on the first conductive layer 421 using the plating method.

The front electrode 41 shown in FIG. 3 had specific resistance ρ of about $3.3 \times 10^{-6}$ Ωm, a width of about 70 μm, a height of about 15 μm, and a cross-sectional area S of about 953 μm². On the other hand, when the front electrode was formed using Ag through a screen printing method according to the related art, the front electrode according to the related art had specific resistance ρ of about $1 \times 10^{-6}$ Ωm, a width of about 120 μm, and a height of about 30 μm.

As described above, in the embodiment, because the first conductive layers 411 and 421 are formed using the direct printing method capable of forming a layer having a density greater than a related art layer formed using the screen printing method, the densities of the first conductive layers 411 and 421 are greater than a density of the related art layer, and thus specific resistances of the first conductive layers 411 and 421 greatly decrease. Further, cross-sectional areas of the first conductive layers 411 and 421 used as a seed layer of a plating process for forming the front electrode 41 and the current collector 42 decrease, and widths of the first conductive layers 411 and 421 used as the seed layer decrease.

In addition to the first conductive layers 411 and 421, because the second conductive layers 412 and 422 are formed using the plating method capable of forming a layer having a density greater than a layer formed using the direct printing method, specific resistances of the front electrode 41 and the current collector 42 further decrease. Thus, electrical conductivities of the front electrode 41 and the current collector 42 greatly increase.

Specific resistance of the front electrode 41 was reduced to about ⅓ of specific resistance of the related art front electrode because of these reasons, and also the cross-sectional area of the front electrode 41 required to serve as an electrode was reduced to about ⅓ of a cross-sectional area of the related art front electrode because of a reduction in the specific resistance. Thus, the width and the height of the front electrode 41 were greatly reduced as compared with the related art front electrode.

As above, because the widths of the front electrodes 41 and the current collectors 42 formed on the front surface of the substrate 10 corresponding to the incident surface are reduced, the light receiving area of the solar cell 1 increases. Hence, the efficiency of the solar cell 1 is improved. Further, the manufacturing cost of the solar cell 1 is reduced because of a reduction in the widths and the heights of the front electrodes 41 and the current collectors 42. Because the total height of the solar cell 1 is reduced, it is easy to perform a laminating process required to manufacture a solar cell module.

An operation of the solar cell 1 according to the embodiment of the invention having the above-described structure is described below.

When light irradiated to the solar cell 1 is incident on the substrate 10 through the transparent conductive oxide layer 30 and the emitter layer 20, a plurality of electron-hole pairs are generated in the substrate 10 by light energy based on the incident light. The electron-hole pairs are separated by the p-n junction of the substrate 10 and the emitter layer 20, and the separated electrons move to the n-type emitter layer 20 and the separated holes move to the p-type substrate 10. Then, the electrons moving to the n-type emitter layer 20 are collected by the front electrodes 41 through the transparent conductive oxide layer 30 and then move to the current collectors 42. The holes moving to the p-type substrate 10 move to the rear electrode 50. When the current collectors 42 are connected to the rear electrode 50 using electric wires, current flows therein to thereby enable use of the current for electric power. In this case, because the widths of the front electrodes 41 and the current collectors 42 formed using the direct printing method and the plating method decreases, the light receiving area of the solar cell 1 increases, and thus the efficiency of the solar cell 1 is improved.

The solar cell 1 according to the embodiment of the invention may further include a back surface field (BSF) layer between the substrate 10 and the rear electrode 50. In this case, the BSF layer is formed of amorphous semiconductor, such as amorphous silicon, and is more heavily doped with impurities of the same conductive type as the substrate 10 than the substrate 10. Thus, the movement of unwanted carries (e.g., electrons) to the rear surface of the substrate 10 is prevented or reduced by a potential barrier resulting from a difference between impurity doping concentrations of the substrate 10 and the BSF layer. In other words, the BSF layer prevents or reduces a recombination and/or a disappearance of the electrons and the holes around the surface of the substrate 10.

A method of manufacturing the solar cell 1 according to the embodiment of the invention is described below with reference to FIGS. 4A to 4D.

FIGS. 4A to 4D are cross-sectional views sequentially illustrating each of stages in a method of manufacturing a solar cell according to an embodiment of the invention.

Figure 4A:
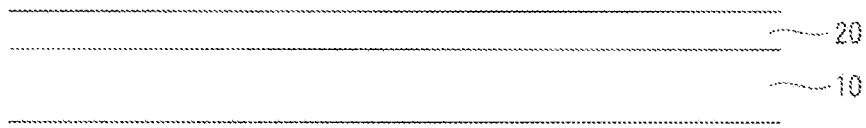
FIGS. 4A to 4D are cross-sectional views sequentially illustrating each of stages in a method of manufacturing a solar cell according to an embodiment of the invention.

First, as shown in FIG. 4A, an n-type amorphous silicon thin film is formed on the substrate 10 formed of p-type single crystal silicon to form the emitter layer 20. The emitter layer 20 is formed on the substrate 10 using a stacking method, such as a chemical vapor deposition (CVD) method and/or a physical vapor deposition (PVD) method. Other methods may be used for the emitter layer 20.

Before forming the emitter layer 20, a saw damage removal process for removing a damage generated in the surface of the substrate 10, a texturing process for forming a plurality of uneven portions on the surface of the substrate 10 to increase an amount of incident light, a substrate cleaning process, etc., may be performed to thereby improve a surface state of the substrate 10. Since these processes are widely known to those skilled in the art, a further description may be briefly made or may be entirely omitted.

Figure 4B:
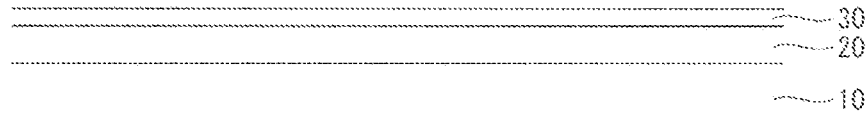

Next, as shown in FIG. 4B, the transparent conductive oxide layer 30 is formed on the emitter layer 20. The transparent conductive oxide layer 30 may be formed by coating a paste for the transparent conductive oxide layer 30 on the emitter layer 20 and then performing a thermal process, a deposition process, such as a sputtering process, or a plating process on the coated paste. The transparent conductive oxide layer 30 may be formed of material selected from the group consisting of indium tin oxide (ITO), tin-based oxide (e.g., $SnO_2$), AgO, $ZnO$—$Ga_2O_3$ (or $ZnO$—$Al_2O_3$), fluorine tin oxide (FTO), and a combination thereof. Other materials may be used.

Figure 4C:
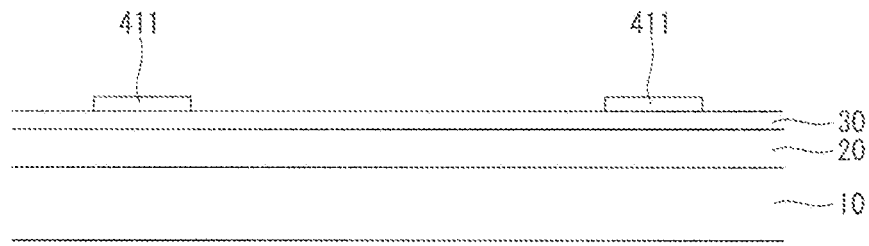

Next, as shown in FIG. 4C, the plurality of first conductive layers 411 of a desired shape for the plurality of front electrodes 41 and the plurality of first conductive layers 421 of a desired shape for the plurality of current collectors 42 are formed in desired portions of the transparent conductive oxide layer 30 using the direct printing method. The direct printing method used to form the first conductive layers 411 and 421 may be one of the inkjet printing method, the EHD jet printing method, the offset printing method, the gravure printing method, the flexo printing method, and the aerosol jet printing method or others. The first conductive layers 411 and 421 may be formed of at least one conductive metal material selected from the group consisting of Ni, Cu, Ag, Al, Sn, Zn, In, Ti, Au, and a combination thereof.

The first conductive layers 411 and 421 formed using the direct printing method each have a density greater than and specific resistance less than a layer formed using the screen printing method. Further, it is difficult to reduce a width of the layer formed using the screen printing method to a desired width because of characteristics of the screen printing method. However, a width of each of the first conductive layers 411 and 421 formed using the direct printing method is smaller than a minimum width of the layer formed using the screen printing method.

Figure 4D:
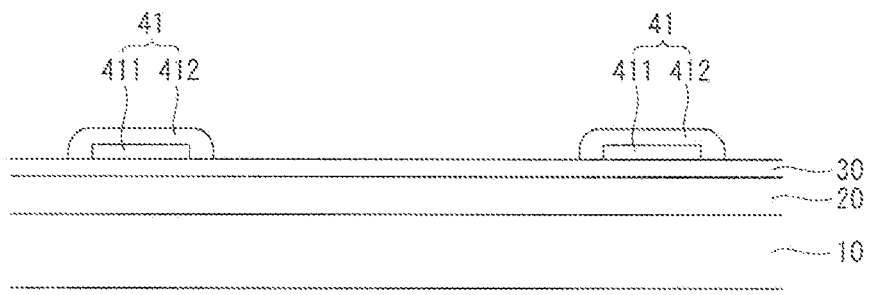

Next, as shown in FIG. 4D, an electroplating process is performed using each of the first conductive layers 411 and 421 as a seed layer to form the second conductive layers 412 and 422 on formation portions of the first conductive layers 411 and 421. Hence, the plurality of front electrodes 41 each including the first and second conductive layers 411 and 412 and the plurality of current collectors 42 each including the first and second conductive layers 421 and 422 are completed.

In the electroplating process illustrated in FIG. 4D, plating is performed only on desired portions (i.e., only on the first conductive layers 411 and 421) in consideration of conductivity difference using a difference between specific resistances of the first conductive layers 411 and 421 and specific resistance of the transparent conductive oxide layer 30 to form the second conductive layers 412 and 422. Because a layer formed using the plating method has characteristics better than a layer formed using the direct printing method, the densities of the second conductive layers 412 and 422 are greater than the densities of the first conductive layers 411 and 421.

In the embodiment of the invention, because the direct printing method and the plating method are used to form the front electrodes 41 and the current collectors 42 instead of the screen printing method, the manufacturing cost of the solar cell 1 is reduced.

In other words, in case of a hetero junction solar cell, because an amorphous semiconductor is stacked on a crystalline semiconductor substrate to form an emitter layer, a subsequent process has to be performed at a low temperature equal to or less than about 200° C. so as to prevent or reduce a damage of the emitter layer at a high temperature. Accordingly, in the related art, a front electrode was formed using a low temperature fired paste capable of performing (or enabling) a firing process at a low temperature. However, because the low temperature fired paste is generally more expensive than a high temperature fired paste, the manufacturing cost of the related art solar cell is increased, and efficiency of the related art solar cell is reduced because of an increase in the specific resistance of the front electrode.

On the other hand, when the front electrodes 41 and the current collectors 42 are formed according to the method described in the present embodiment, the manufacturing cost of the solar cell 1 is reduced because the expensive low temperature fired paste is not used.

Further, because the direct printing method and the plating method capable of forming a layer having a density greater than a layer formed using the screen printing method are used, the conductivities of the front electrodes 41 and the current collectors 42 is improved. Hence, the widths of the front electrodes 41 and the current collectors 42 may be reduced to a desired width without a reduction in a carrier transfer rate. As a result, the light receiving area of the solar cell 1 increases.

Furthermore, because the plating method may be performed at a normal temperature and enables a large number of layers to be formed at once, the manufacturing efficiency of the solar cell 1 is improved.

Next, after the front electrodes 41 and the current collectors 42 are formed, the rear electrode 50 is formed substantially on the entire rear surface of the substrate 10 to complete the solar cell 1 shown in FIG. 1. The rear electrode 50 is formed by coating a rear electrode paste on the rear surface of the substrate 10 using the screen printing method and then firing the rear electrode paste. Other methods, such as a plating method, a physical vapor deposition (PVD) method such as a sputtering method and an electron beam (E-beam) evaporation method, and a chemical vapor deposition (CVD) method, may be used.

Figure 5:
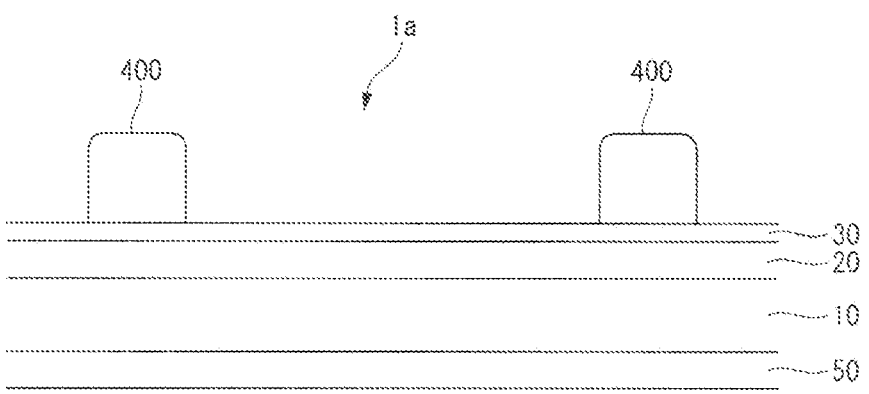
FIG. 5 is a partial cross-sectional view of a solar cell according to another embodiment of the invention.

FIG. 5 is a partial cross-sectional view of a solar cell according to an embodiment of the invention.

As shown in FIG. 5, a solar cell 1a according to an embodiment of the invention has a structure similar to the solar cell 1 shown in FIG. 1. Thus, structures and components identical or equivalent to those illustrated in FIG. 1 are designated with the same reference numerals, and a further description may be briefly made or may be entirely omitted. Further, since the solar cell 1a shown in FIG. 5 has the same disposition diagram as the solar cell 1 shown in FIG. 1, a disposition diagram of the solar cell 1a is omitted.

The solar cell 1a according to the embodiment of the invention includes a substrate 10, an emitter layer 20 on a front surface of the substrate 10 on which light is incident, a transparent conductive oxide layer 30 on the emitter layer 20, a plurality of front electrodes 400 that are formed on the transparent conductive oxide layer 30 and electrically connected to the transparent conductive oxide layer 30, and a rear electrode 50 that is formed on a rear surface of the substrate 10, on which the light is not incident, opposite the front surface of the substrate 10 and is electrically connected to the substrate 10. The solar cell 1a of FIG. 5 further includes a plurality of current collectors, that are electrically connected to the plurality of front electrodes 400 and extend substantially parallel to one another in a direction crossing the front electrodes 400, in the same manner as the solar cell 1 shown in FIG. 1.

Unlike the front electrodes 41 of the solar cell 1 shown in FIG. 1, the front electrodes 400 of the solar cell 1*a* each include one conductive layer. Further, a height of the front electrode 400 is greater than the height of the front electrode 41, and thus an aspect ratio of the front electrode 400 is greater than an aspect ratio of the front electrode 41. Hence, conductivity of the front electrodes 400 is improved. As a result, efficiency of the solar cell 1*a* is further improved compared with the efficiency of the solar cell 1.

FIGS. 6A to 6E are cross-sectional views sequentially illustrating each of stages in a method of manufacturing the solar cell 1*a* according to the embodiment of the invention.

Figure 6A:
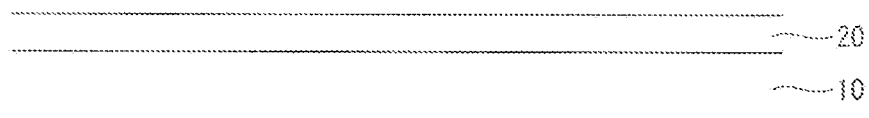
FIGS. 6A to 6E are cross-sectional views sequentially illustrating each of stages in a method of manufacturing a solar cell according to another embodiment of the invention.
Figure 6B:
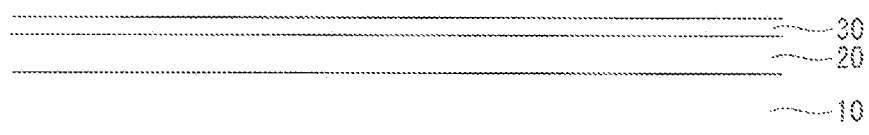

As shown in FIGS. 6A and 6B, the emitter layer 20 is formed on the substrate 10, and then the transparent conductive oxide layer 30 is formed on the emitter layer 20 in the same manner as FIGS. 4A and 4B.

Figure 6C:
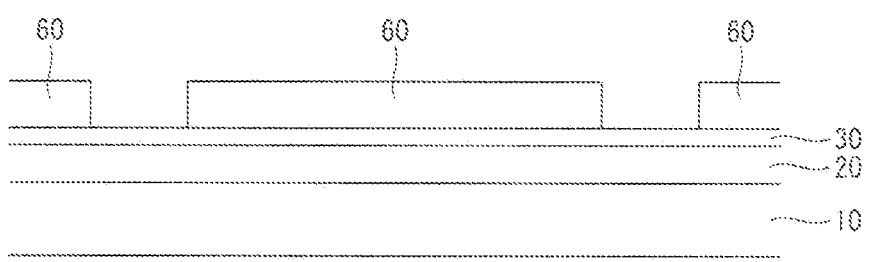

Next, as shown in FIG. 6C, a plurality of plating resist layers 60 formed of a polymer-based insulating material are formed on portions of the transparent conductive oxide layer 30, except where the front electrodes 400 will be formed, using a direct printing method. Hence, portions of the transparent conductive oxide layer 30, on which the plating resist layers 60 are not formed, become exposed. Examples of the direct printing method includes an inkjet printing method, an EHD jet printing method, an offset printing method, a gravure printing method, a flexo printing method, and an aerosol jet printing method. The plating resist layers 60 may be formed on the transparent conductive oxide layer 30 using other methods other than the direct printing method.

Figure 6D:
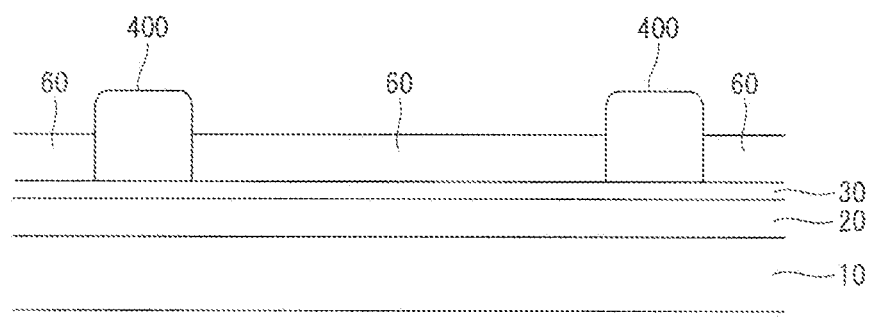

Next, as shown in FIG. 6D, a plating process is performed using the exposed portions of the transparent conductive oxide layer 30 as a seed layer to form a plating material on the exposed portions of the transparent conductive oxide layer 30 to a desired thickness. Hence, the front electrodes 400 are formed.

Figure 6E:
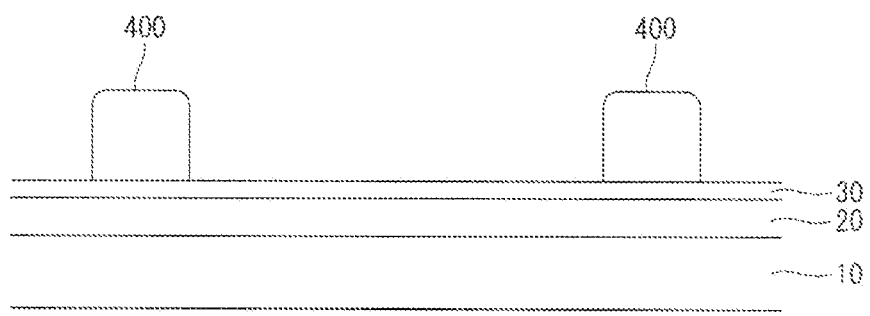

Next, as shown in FIG. 6E, the plating resist layers 60 are removed using an etching process to complete the front electrodes 400. In this case, an etch stop layer may be formed in a portion where the etching process does not need to be performed, and then the etch stop layer may be removed after performing the etching process. In the embodiment, a thickness of the front electrode 400 varies depending on a material used, a thickness of the plating resist layer 60, time required in the plating process, etc.

Furthermore, when the front electrodes 400 are formed, the plurality of current collectors are formed on the transparent conductive oxide layer 30 in the same manner as a formation method of the front electrodes 400.

Subsequently, the rear electrode 50 is formed on the rear surface of the substrate 10 in the same manner as a formation method of the rear electrode 50 shown in FIG. 1 to complete the solar cell 1*a* shown in FIG. 5.

As above, because the front electrodes 400 are formed using the plating method capable of greatly increasing a density of a formation layer without using the screen printing method, specific resistance of the front electrodes 400 is greatly reduced, and conductivity of the front electrodes 400 increases as described above with reference to FIGS. 1 to 4D. Thus, the front electrodes 400 each having smaller width and height than the related art may be formed without a reduction in a carrier transfer rate.

Further, if the front electrodes 400 are formed only in desired portions using the plating resist layers 60 formed of the insulating material, an aspect ratio of the front electrode 400 may be greater than the aspect ratio of the front electrode 41 shown in FIGS. 1 to 4D.

In other words, because the plating is performed on non-formation portions of the plating resist layers 60 (i.e., the exposed portions of the transparent conductive oxide layer 30), a thickness of a plating layer is formed in proportion to a thickness of the plating resist layer 60.

Accordingly, if the thickness of the plating resist layer 60 increases, the front electrode 400 having the thickness equal to or greater than the thickness of the plating resist layer 60 may be obtained. Hence, the front electrode 400 corresponding to a plating layer thicker than the front electrode 41 including the first and second conductive layers 411 and 412 may be obtained by employing (or varying) the thickness of the plating resist layer 60.

As a result, aspect ratios of the front electrode 400 and the current collector of the solar cell 1*a* are greater than aspect ratios of the front electrode 41 and the current collector 42 of the solar cell 1. Further, resistances of the front electrode 400 and the current collector of the solar cell 1*a* are less than resistances of the front electrode 41 and the current collector 42 of the solar cell 1. Conductivities of the front electrode 400 and the current collector of the solar cell 1*a* are greater than conductivities of the front electrode 41 and the current collector 42 of the solar cell 1. Thus, the efficiency of the solar cell 1*a* is improved compared with the solar cell 1.

As described above, because the front electrodes 400 and the current collectors of the solar cell 1*a* are formed using the direct printing method and the plating method without using a low temperature fired paste, the manufacturing cost of the solar cell 1*a* is greatly reduced. Further, because the plating method capable of processing a large number of layers at once at a normal temperature is used, the manufacturing efficiency of the solar cell 1*a* is improved.

The embodiments in which the front electrodes 41 and 400, and the current collectors 42 are formed using the direct printing method and the plating method may be applied to other solar cells other than the solar cells 1 and 1*a* illustrated in FIGS. 1 to 6E.

Other solar cells to which the embodiments of the invention are applied are described below.

Figure 7:
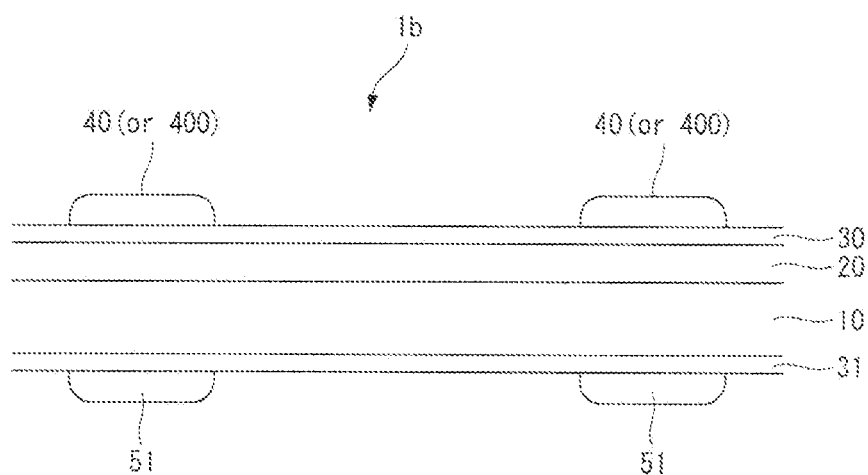
FIG. 7 is a partial cross-sectional view of a solar cell according to another embodiment of the invention.

FIG. 7 is a partial cross-sectional view of a solar cell according to an embodiment of the invention.

As shown in FIG. 7, a solar cell 1*b* according to an embodiment of the invention, similar to the solar cells 1 and 1*a* shown in FIGS. 1 and 5, includes a substrate 10, an emitter layer 20, a transparent conductive oxide layer 30, a plurality of front electrodes 41 (or 400), and a plurality of rear electrodes 51.

Unlike the solar cells 1 and 1*a* shown in FIGS. 1 and 5, the solar cell 1*b* further includes a transparent conductive oxide layer 31 on a rear surface of the substrate 10. The transparent conductive oxide layer 31 is formed between the substrate 10 and the rear electrodes 51 using the same formation method as the transparent conductive oxide layer 30.

The transparent conductive oxide layer 31 has functions similar to the transparent conductive oxide layer 30. More specifically, the transparent conductive oxide layer 31 is used as a path for transferring carriers (e.g., holes) moving to the substrate 10 to the plurality of rear electrodes 51 and serves as an anti-reflection layer.

The plurality of rear electrodes 51 are formed on portions of the transparent conductive oxide layer 31 using the same formation method as the front electrodes 41 (or 400). Each of the rear electrodes 51 includes a first conductive layer formed using a direct printing method and a second conductive layer formed using a plating method, or includes a conductive layer formed using a plating method.

The plurality of rear electrodes 51 are mainly positioned in portions facing the front electrodes 41 (or 400) and extend substantially parallel to one another in a fixed direction (for example, in the same direction as the front electrodes 41 (or 400)). Further, the rear electrodes 51 are electrically connected to the transparent conductive oxide layer 31 and collect carriers transferred through the transparent conductive oxide layer 31.

In the solar cell 1b, the transparent conductive oxide layers 30 and 31 are respectively formed on the front surface and the rear surface of the substrate 10, and the plurality of rear electrodes 51 are spaced apart from one another in the same manner as the front electrodes 41 (or 400). Because light is incident on the substrate 10 through both the front surface and the rear surface of the substrate 10, an amount of light incident on the solar cell 1b increases.

The solar cell 1b may further include a plurality of current collectors that are formed on the transparent conductive oxide layer 30 on the front surface of the substrate 10 and extend in a direction crossing the plurality of front electrodes 41 (or 400), and a plurality of current collectors that are formed at an edge of the transparent conductive oxide layer 31 on the rear surface of the substrate 10 and extend in a direction crossing the plurality of rear electrodes 51. The current collectors on the transparent conductive oxide layer 30 have the same structure as the front electrodes 41 (or 400), and the current collectors on the transparent conductive oxide layer 31 have the same structure as the rear electrodes 51. Thus, when the front electrodes 41 (or 400) and the rear electrodes 51 are formed, the current collectors are formed at corresponding locations.

As described above with reference to FIGS. 1 to 6E, in the solar cell 1b, the manufacturing cost is reduced, manufacturing efficiency is improved, and operation efficiency is further improved because an amount of light incident on the substrate 10 increases.

Since components of the solar cell 1b including the transparent conductive oxide layer 31 and the rear electrodes 51 are formed using the same manufacturing method as FIG. 1 and FIGS. 4A to 4D or FIG. 5 and FIGS. 6A to 6E, a detailed description of a method of manufacturing the solar cell 1b may be briefly made or may be entirely omitted. Further, since the current collectors connected to the front electrodes 41 (or 400) and the current collectors connected to the rear electrodes 51 are formed using the same method as the front electrodes 41 (or 400) and the rear electrodes 51 when the front electrodes 41 (or 400) and the rear electrodes 51 are formed, a further description may be briefly made or may be entirely omitted.

Since a disposition diagram of the solar cell 1b is substantially the same as the solar cell 1 shown in FIG. 1, except that the rear electrodes 51 and the current collectors connected to the rear electrodes 51 have substantially the same shape as the front electrodes 41 and the current collectors 42 of the solar cell 1 shown in FIG. 1, the disposition diagram of the solar, cell 1b is omitted.

A solar cell 1c according to an embodiment of the invention is described below with reference to FIGS. 8 to 10E. Structures and components identical or equivalent to those illustrated in the solar cells 1, 1a, and 1b described above are designated with the same reference numerals, and a further description may be briefly made or may be entirely omitted. In the solar cell 1c, both first and second electrodes are formed on a rear surface of a substrate 10 on which light is not incident.

Figure 8:
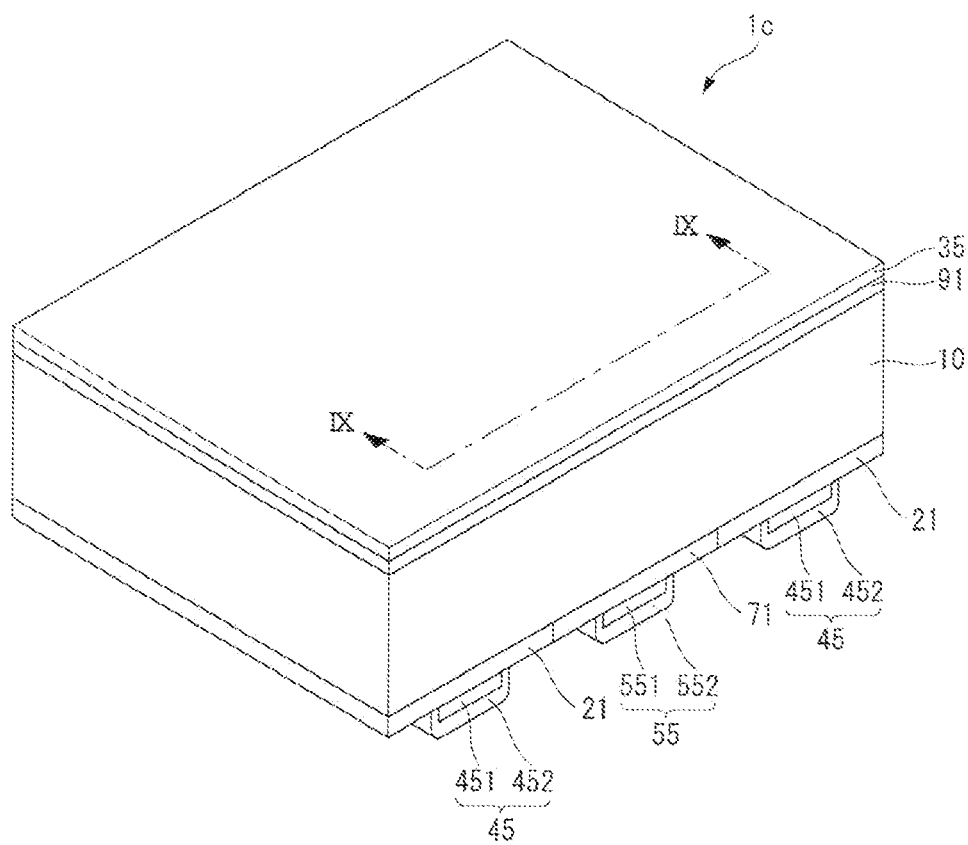
FIG. 8 is a partial perspective view of a solar cell according to another embodiment of the invention.
Figure 9:
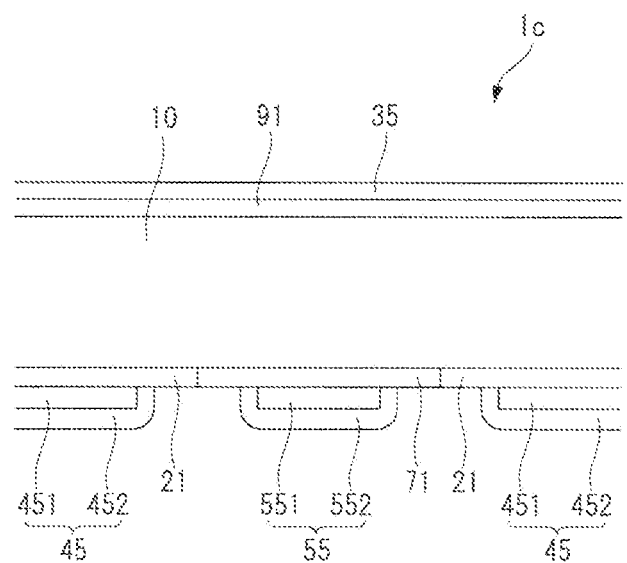
FIG. 9 is a cross-sectional view taken along the line IX-IX of FIG. 8.

FIG. 8 is a partial perspective view of the solar cell 1c according to the embodiment of the invention. FIG. 9 is a cross-sectional view taken along the line IX-IX of FIG. 8;

The solar cell 1c shown in FIGS. 8 and 9 includes a substrate 10 formed of crystalline silicon, a plurality of emitter layers 21 and a plurality of BSF layers 71 on a rear surface of the substrate 10, a passivation layer 91 on a front surface of the substrate 10, an anti-reflection layer 35 on the passivation layer 91, a plurality of first electrodes 45 respectively positioned on the plurality of emitter layers 21, and a plurality of second electrodes 55 respectively positioned on the plurality of BSF layers 71.

The plurality of emitter layers 21 on the rear surface of the substrate 10 extend substantially parallel to one another in a fixed direction and are formed of amorphous semiconductor such as amorphous silicon.

Because the plurality of emitter layers 21 and the substrate 10 form a p-n junction as described above, the plurality of emitter layers 21 contain impurities of a conductive type opposite a conductive type of the substrate 10.

The plurality of emitter layers 21 and the plurality of BSF layers 71 are alternately formed on the rear surface of the substrate 10. The plurality of BSF layers 71 extend substantially parallel to one another along the plurality of emitter layers 21.

The BSF layers 71 are formed of amorphous semiconductor such as amorphous silicon. The BSF layers 71 are regions (e.g., p+-type regions) that are more heavily doped with impurities of the same conductive type as the substrate 10 than the substrate 10.

The movement of electrons to the rear surface of the substrate 10 is prevented or reduced by a potential barrier resulting from a difference between impurity doping concentrations of the substrate 10 and the BSF layers 71. Thus, the BSF layers 71 prevent or reduce a recombination and/or a disappearance of the electrons and the holes around the surface of the substrate 10.

The passivation layer 91 on the front surface of the substrate 10 converts defects, like a dangling bond, existing around the surface of the substrate 10 into stable bonds to prevent or reduce a recombination and/or a disappearance of carriers (e.g., holes) moving to the substrate 10 resulting from the defects.

In the embodiment, the passivation layer 91 is formed of amorphous semiconductor, such as amorphous silicon. The passivation layer 91 may be formed of silicon oxide (SiOx) or silicon nitride (SiNx), for example.

The anti-reflection layer 35 on the passivation layer 91 reduces a reflectance of light incident on the solar cell 1c and increases a selectivity of a predetermined wavelength band. Hence, the efficiency of the solar cell 1c is improved. The anti-reflection layer 35 is a transparent layer, formed of a transparent material, having a refractive index of about 1.8 to 2.2. The anti-reflection layer 35 is formed of silicon oxide (SiOx) or silicon nitride (SiNx), for example.

Figure 2:
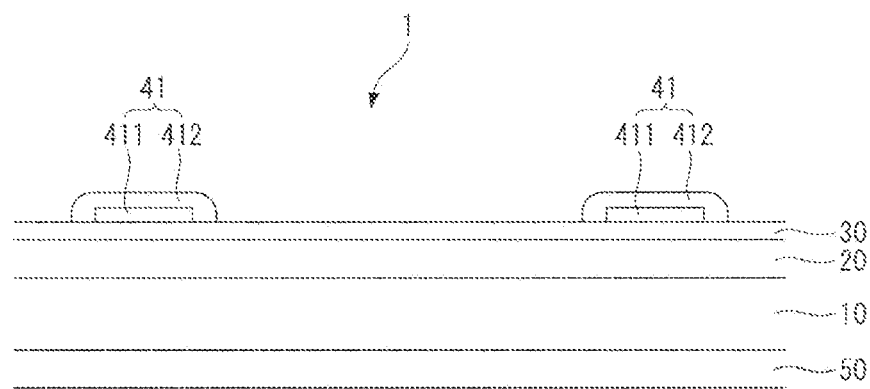
FIG. 2 is a cross-sectional view taken along the line II-II of FIG. 1.

Although the plurality of first electrodes 45 and the plurality of second electrodes 55 are different from each other in a formation location, the plurality of first electrodes 45 and the plurality of second electrodes 55 have the same structure as the first electrode 41 of the solar cell 1 illustrated in FIGS. 1 and 2. Thus, each of the first electrodes 45 includes a first conductive layer 451, and a second conductive layer 452 on the first conductive layer 451, and each of the second electrodes 55 includes a first conductive layer 551, and a second conductive layer 552 on the first conductive layer 551.

The first conductive layers 451 and 551 are formed of at least one conductive metal material selected from the group consisting of Ni, Cu, Ag, Al, Sn, Zn, In, Ti, Au, and a combination thereof, or a transparent conductive material, such as Al-doped ZnO (AZO) and ITO, using a direct printing method. A width and a height of each of the first conductive layers 451 and 551 may be approximately several μm to several nm.

The second conductive layers 452 and 552 are respectively formed on the first conductive layers 451 and 551 through a plating method (for example, an electroplating method) using the first conductive layers 451 and 551 as a seed layer. The second conductive layers 452 and 552 are formed of at least one conductive metal material selected from the group consisting of Ni, Cu, Ag, Al, Sn, Zn, In, Ti, Au, and a combination thereof.

The plurality of first electrodes 45 collect carriers moving to the emitter layers 21, and the plurality of second electrodes 55 collect carriers moving through the BSF layers 71.

As described above, because the first electrodes 45 and the second electrodes 55 are formed using the direct printing method and the plating method, a density of each of the first and second electrodes 45 and 55 increases as described above with reference to FIGS. 1 and 2. Hence, a carrier transfer rate of each of the first and second electrodes 45 and 55 increases. As a result, the efficiency of the solar cell 1c is improved. Further, because an electrode density of the rear surface of the substrate 10 is reduced by a reduction in the width of each of the first and second electrodes 45 and 55, the number of first electrodes 45 and the number of second electrodes 55 can increase. Thus, the carrier transfer efficiency of the solar cell 1c is improved.

FIGS. 10A to 10E are cross-sectional views sequentially illustrating each of stages in a method of manufacturing the solar cell 1c according to the embodiment of the invention.

Figure 10A:
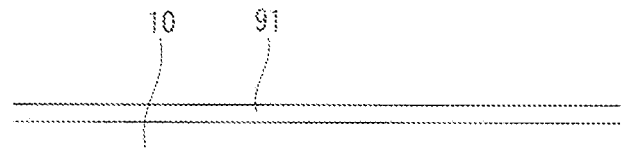
FIGS. 10A to 10E are cross-sectional views sequentially illustrating each of stages in a method of manufacturing a solar cell according to another embodiment of the invention.
Figure 10B:
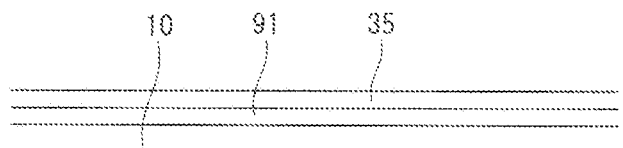

First, as shown in FIG. 10A, amorphous silicon is stacked on the substrate 10 formed of first conductive type crystalline silicon to form the passivation layer 91. Then, as shown in FIG. 10B, silicon oxide (SiOx) or silicon nitride (SiNx) is stacked on the passivation layer 91 to form the anti-reflection layer 35. The passivation layer 91 and the anti-reflection layer 35 may be formed using a CVD method or a PVD method, for example.

Figure 10C:
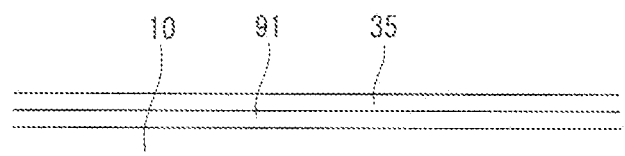
Figure 10C:
Figure 10D:
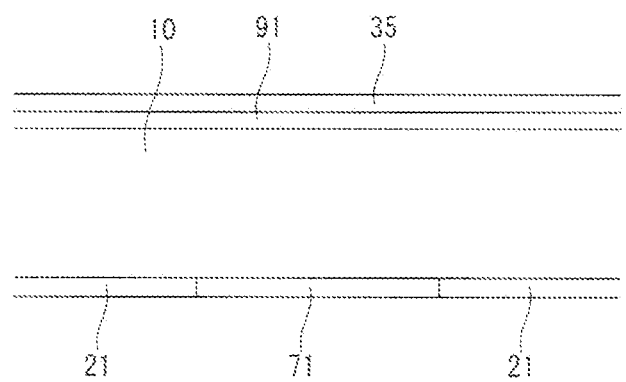

Next, as shown in FIGS. 10C and 10D, a stack prevention layer or a mask is positioned on a corresponding portion of the rear surface of the substrate 10, and then amorphous silicon containing second conductive type impurities is stacked on exposed portions of the rear surface of the substrate 10, on which the stack prevention layer or the mask is not positioned, to form the plurality of emitter layers 21 and the plurality of BSF layers 71. Then, the stack prevention layer or the mask is removed. The emitter layers 21 and the BSF layers 71 may be formed using a PECVD method or a sputtering method, for example. The stacking order of the emitter layers 21 and the BSF layers 71 may vary.

Figure 10E:
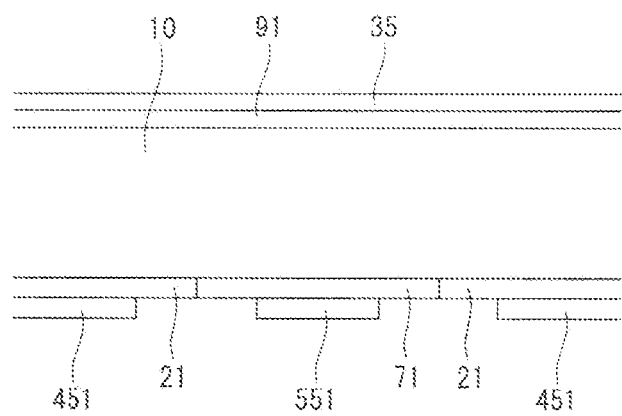

Next, as shown in FIG. 10E, the first conductive layers 451 and 551 are respectively formed on the emitter layers 21 and the BSF layers 71 using the direct printing method, similar to the process illustrated in FIC. 4C. The first conductive layers 451 and 551 are formed of a transparent conductive material or a conductive metal material.

Next, similar to the description illustrated in FIC. 1, the transparent conductive material or the conductive metal material is plated on the first conductive layers 451 and 551 using an electroplating method using the first conductive layers 451 and 551 as a seed layer to form the second conductive layers 452 and 552. Hence, the plurality of first electrodes 45 and the plurality of second electrodes 55 are formed to complete the solar cell 1c shown in FIGS. 8 and 9.

A solar cell 1d according to an embodiment of the invention is described below with reference to FIGS. 11 and 13E. Structures and components identical or equivalent to those illustrated in the solar cells 1, 1a, 1b, and 1c described above are designated with the same reference numerals, and a further description may be briefly made or may be entirely omitted. In the solar cell 1d, both first and second electrodes are formed on a rear surface of a substrate 10 on which light is not incident.

Figure 11:
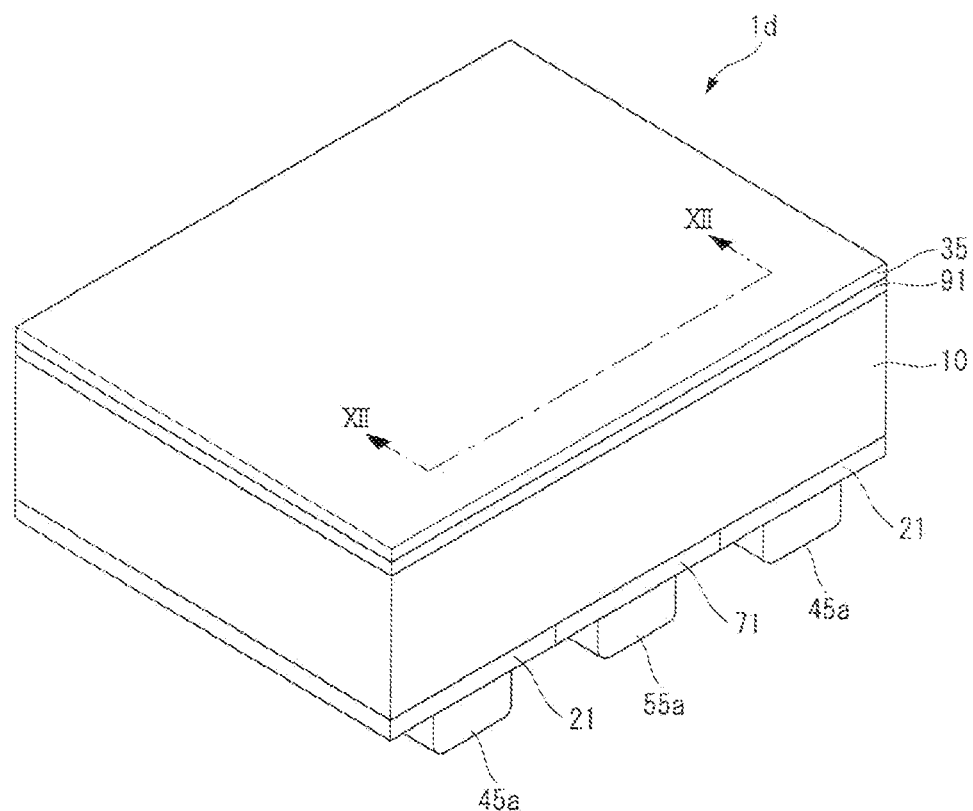
FIG. 11 is a partial perspective view of a solar cell according to another embodiment of the invention.
Figure 12:
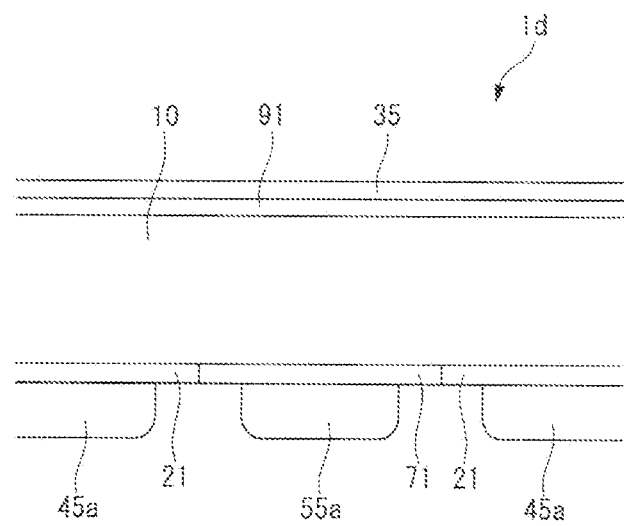
FIG. 12 is a cross-sectional view taken along the line XII-XII of FIG. 11.

FIG. 11 is a partial perspective view of the solar cell 1d according to the embodiment of the invention. FIG. 12 is a cross-sectional view taken along the line XII-XII of FIG. 11. The solar cell 1d shown in FIGS. 11 and 12 has substantially the same structure as the solar cell 1c shown in FIGS. 8 and 9, except a structure of each of a plurality of first electrodes and a plurality of second electrodes.

The solar cell 1d shown in FIGS. 11 and 12 includes a substrate 10 formed of crystalline silicon, a plurality of emitter layers 21 and a plurality of BSF layers 71 on a rear surface of the substrate 10, a passivation layer 91 on a front surface of the substrate 10, an anti-reflection layer 35 on the passivation layer 91, a plurality of first electrodes 45a respectively positioned on the plurality of emitter layers 21, and a plurality of second electrodes 55a respectively positioned on the plurality of BSF layers 71.

The plurality of first electrodes 45a and the plurality of second electrodes 55a have the same structure as the front electrode 400 of the solar cell 1a illustrated in FIG. 5. Thus, the first electrodes 45a and the second electrodes 55a each include one conductive layer, unlike the first and second electrodes 45 and 55 of the solar cell 1c illustrated in FIGS. 8 and 9. An aspect ratio of the first and second electrodes 45a and 55a is greater than an aspect ratio of the first and second electrodes 45 and 55. Thus, conductivity of the first and second electrodes 45a and 55a is improved, and the efficiency of the solar cell 1d is improved.

A method of manufacturing the solar cell 1d is described below with reference to FIGS. 13A to 13E as well as FIGS. 10A to 10D. FIGS. 13A to 13E are cross-sectional views sequentially illustrating each of stages in a method of manufacturing the solar cell 1d according to the embodiment of the invention.

First, as shown in FIGS. 10A to 10D, the passivation layer 91, the anti-reflection layer 35, the plurality of emitter layers 21, and the plurality of BSF layers 71 are formed on the substrate 10.

Figure 13A:
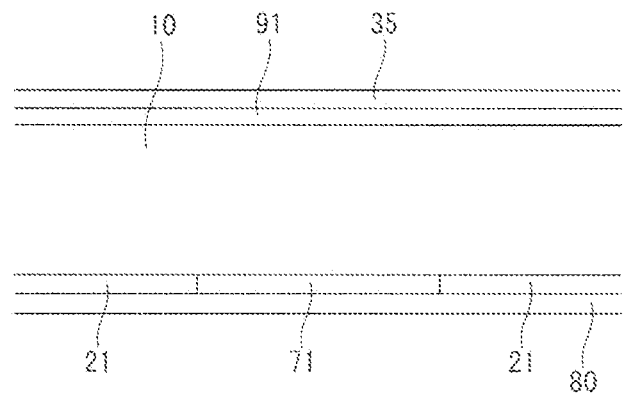
FIGS. 13A to 13E are cross-sectional views sequentially illustrating each of stages in a method of manufacturing a solar cell according to another embodiment of the invention.

Next, as shown in FIG. 13A, a conductive layer 80 is formed on the entire rear surface of the substrate 10, on which the plurality of emitter layers 21 and the plurality of BSF layers 71 are formed, using a CVD method or a PVD method. The conductive layer 80 is formed of a transparent conductive material or a conductive metal material and has a height of about several μm to several nm.

Figure 13B:
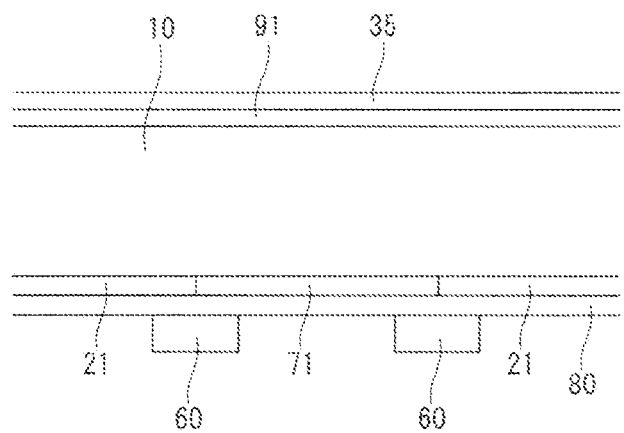

Next, as shown in FIG. 13B, plating resist layers 60 formed of an insulating material are formed on portions of the conductive layer 80 using the direct printing method. Hence, portions of the conductive layer 80, on which the plating resist layers 60 are not formed, are exposed to the outside. Alternatively, the plating resist layers 60 may be formed on the conductive layer 80 using other methods instead of the direct printing method.

Figure 13C:
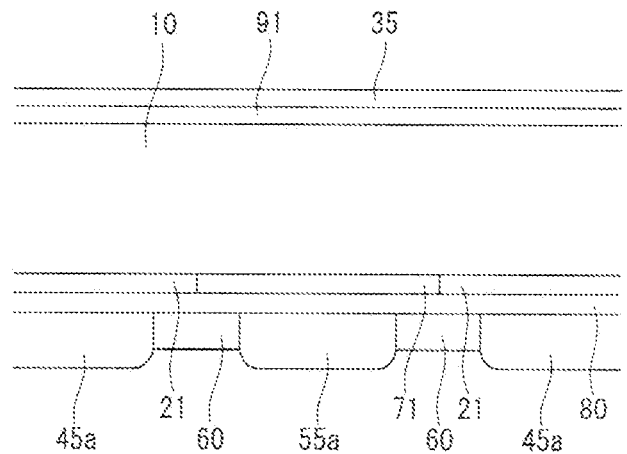

Next, as shown in FIG. 13C, similar to the process illustrated in FIC. 6D, a plating process is performed using the exposed portions of the conductive layer 80 as a seed layer to form a plating material on the exposed portions of the conductive layer 80 to a desired thickness. Hence, the first and second electrodes 45a and 55a are formed. The formation thicknesses of the first and second electrodes 45a and 55a vary depending on a material used, a thickness of the plating resist layer 60, time required in the plating process, etc.

Figure 13D:
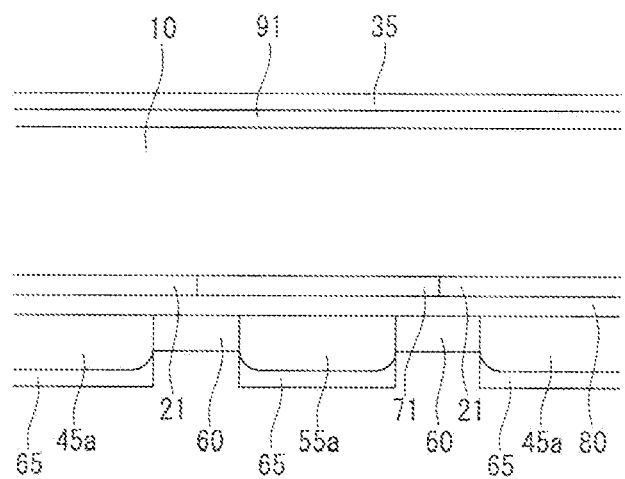
Figure 13E:
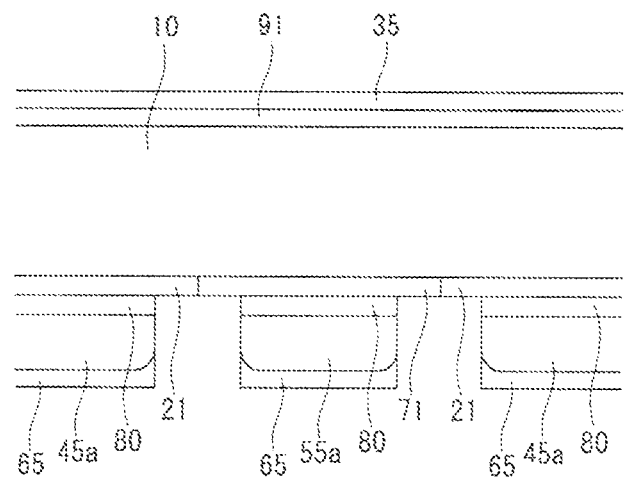

Next, as shown in FIGS. 13D and 13E, etch stop layers 65 are formed on the first and second electrodes 45a and 55a, and then the exposed plating resist layers 60 and the portions of the conductive layer 80 underlying the exposed plating resist layers 60 are sequentially removed. The exposed plating resist layers 60 and the portions of the conductive layer 80 underlying the exposed plating resist layers 60 may be removed through a dry or wet etching process.

Next, the etch stop layers 65 are removed to complete the solar cell 1d shown in FIGS. 11 and 12.

As described above, in the solar cells according to the embodiments of the invention, the first and second electrodes may be formed on the same surface of the substrate. Hence, because at least one of the first and second electrodes is formed using the plating process, the widths of the first and second electrodes decrease and the size of the light receiving portion of the solar cell increases. Thus, the efficiency of the solar cell is improved.

Furthermore, because the density of the electrode formed using the plating process increases, the conductivity of the electrode is improved. Thus, the efficiency of the solar cell is further improved.

In addition, because the expensive low temperature fired paste is not used to form the first and second electrodes, the manufacturing cost of the solar cell is reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
   a crystalline semiconductor substrate having a first type conductivity;
   an emitter layer formed on a front surface of the crystalline semiconductor substrate,
   wherein the emitter layer is formed of a material of a second type conductivity opposite of the first type conductivity, the material of the emitter layer is different from that of the crystalline semiconductor substrate, and the emitter layer forms a hetero junction as well as a p-n junction with the crystalline semiconductor substrate;
   a first transparent conductive oxide layer positioned on the emitter layer;
   a second transparent conductive oxide layer positioned on a rear surface of the crystalline semiconductor substrate;
   a first electrode part positioned on the first transparent conductive oxide layer and electrically connected to the emitter layer through the first transparent conductive oxide layer, wherein the first electrode part includes a plurality of first electrodes spaced apart from one another in a first direction and a first electrode collector in a second direction crossing the first direction; and
   a second electrode part positioned on the second transparent conductive oxide layer and electrically connected to the rear surface of the crystalline semiconductor substrate through the second transparent conductive oxide layer, wherein the second electrode part includes a plurality of second electrodes spaced apart from one another in the first direction and a second electrode collector in the second direction crossing the first direction,
   wherein the first electrode part includes a first seed layer directly positioned on the first transparent conductive oxide layer, a first plated layer positioned on the first seed layer and electrically connected to the emitter layer through the first seed layer and the first transparent conductive oxide layer,
   wherein the second electrode part includes a second seed layer directly positioned on the second transparent conductive oxide layer, a second plated layer positioned on the second seed layer and electrically connected to the crystalline semiconductor substrate through the second seed layer and the second transparent conductive oxide layer,
   wherein the first electrode part and the second electrode part further include at least one of Ni, Cu, Ag, Al, Sn, Zn, In, Ti and Au,
   wherein the first transparent conductive oxide layer and the first seed layer have different conductivities, and
   wherein the second transparent conductive oxide layer and the second seed layer have different conductivities.

2. The solar cell of claim 1, wherein a density of each of the first seed layer and the second seed layer is different from a density of each of the first plated layer and the second plated layer.

3. The solar cell of claim 2, wherein the density of the first plated layer is greater than the density of the first seed layer, and
   wherein the density of the second plated layer is greater than the density of the second seed layer.

4. The solar cell of claim 1, wherein at least one of the plurality of first electrodes and the plurality of second electrodes has specific resistance of about $3.3 \times 10^{-6}$ Ωcm.

5. The solar cell of claim 1, wherein at least one of the plurality of first electrodes and the plurality of second electrodes has a width of about 10 μm to 100 μm, and
   wherein at least one of the plurality of first electrodes and the plurality of second electrodes has a height of about 10 μm to 20 μm.

6. The solar cell of claim 1, wherein the emitter layer is formed of amorphous silicon.

7. A solar cell comprising:
   a substrate formed of a first conductive type semiconductor;
   an emitter layer formed on a rear surface of the substrate, wherein the emitter layer is formed of a material of a second conductive type semiconductor different from the first conductive type semiconductor, the material of the emitter layer is different from that of the substrate, and the emitter layer forms a hetero junction as well as a p-n junction with the substrate;
   a plurality of first electrodes electrically connected to the emitter layer;
   a back surface field layer formed on the rear surface of the substrate, wherein the back surface field layer is formed of the first type conductivity semiconductor more heavily doped than the substrate; and
   a plurality of second electrodes electrically connected to the back surface field layer,
   wherein the plurality of first electrodes include a first seed layer directly positioned on the emitter layer and a first plated layer positioned on the first seed layer, wherein the plurality of second electrodes include a second seed layer directly positioned on the back surface field layer and a second plated layer positioned on the second seed layer, wherein the substrate is formed of crystalline silicon and the emitter layer is made of amorphous silicon, and wherein the back surface field layer is made of amorphous silicon.

8. The solar cell of claim 7, wherein a density of the first plated layer is greater than a density of the first seed layer, and wherein a density of the second plated layer is greater than a density of the second seed layer.

9. The solar cell of claim 7, wherein the substrate has a conductive type opposite to a conductive type of the emitter layer.

10. The solar cell of claim 7, wherein the rear surface of the substrate, on which the plurality of first electrodes and the plurality of second electrodes are positioned, is opposite to an incident surface of the substrate.

11. The solar cell of claim 7, further comprising a passivation layer positioned on a front surface of the substrate, and wherein the passivation layer includes silicon nitride and silicon dioxide.

12. The solar cell of claim 11, further comprising an anti-reflection layer positioned on the passivation layer, wherein the anti-reflection layer includes silicon nitride and silicon dioxide.

13. The solar cell of claim 1, wherein the first electrode part and the second electrode part face each other.

14. The solar cell of claim 1, wherein at least one of the front surface and the rear surface of the crystalline semiconductor substrate includes a textured surface.

15. The solar cell of claim 1, wherein sides of the first electrode part and the second electrode part are substantially perpendicular relative to the front surface and the rear surface, respectively.

16. The solar cell of claim 1, further comprising a back surface field layer positioned on the rear surface of the crystalline semiconductor substrate, wherein the second electrode part is electrically connected to the crystalline semiconductor substrate through the back surface field layer, and wherein the back surface field layer is formed of amorphous silicon.

17. The solar cell of claim 16, wherein the first plated layer directly contacts a side surface of the first seed layer and the first transparent conductive oxide layer, and wherein the second plated layer directly contacts a side surface of the second layer and the second transparent conductive oxide layer.

18. The solar cell of claim 17, wherein the first and second transparent conductive oxide layers are formed of a material selected from the group consisting of indium tin oxide (ITO), tin-based oxide, $SnO_2$, AgO, $ZnO$—$Ga_2O_3$, $Al_2O_3$, fluorine tin oxide (FTO), and a combination thereof.

19. The solar cell of claim 7, wherein the first plated layer directly contacts a side surface of the first seed layer and the emitter layer, and wherein the second plated layer directly contacts a side surface of the second seed layer and the back surface field layer.

20. The solar cell of claim 7, wherein at least one of the plurality of first electrodes and the plurality of second electrodes has a width of about 10 μm to 100 μm, wherein at least one of the plurality of first electrodes and the plurality of second electrodes has a height of about 10 μm to 20 μm, and wherein the plurality of first electrodes and the plurality of second electrodes include at least one of Ni, Cu, Ag, Al, Sn, Zn, In, Ti and Au.

* * * * *